United States Patent
Law et al.

(10) Patent No.: US 7,668,524 B2
(45) Date of Patent: Feb. 23, 2010

(54) CLOCK DESKEWING METHOD, APPARATUS, AND SYSTEM

(75) Inventors: Hon-Mo Raymond Law, Beaverton, OR (US); Mamun UR Rashid, Folsom, CA (US); Aaron K. Martin, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 616 days.

(21) Appl. No.: 11/318,118

(22) Filed: Dec. 23, 2005

(65) Prior Publication Data

US 2007/0149142 A1    Jun. 28, 2007

(51) Int. Cl.
    *H04B 1/06* (2006.01)
(52) U.S. Cl. .................. 455/260; 455/303; 455/304; 455/259
(58) Field of Classification Search .................. 455/76, 455/260, 20, 23, 24, 41.3, 502, 67.16, 60, 455/147, 148, 303, 304, 258, 259; 375/376; 716/6, 4; 713/503, 401, 400, 500, 600; 327/231, 327/232, 147, 149, 158, 156, 161
See application file for complete search history.

(56) References Cited

U.S. PATENT DOCUMENTS 6,229,368 B1    5/2001 Lee
6,704,881 B1    3/2004 Li et al.
7,439,788 B2 *  10/2008 Law et al. ............. 327/231
2002/0000854 A1 *  1/2002 Hashimoto ............. 327/158
2003/0012322 A1 *  1/2003 Partsch et al. ........... 375/376
2003/0200518 A1 *  10/2003 Saeki .................. 716/6
2005/0044441 A1    2/2005 Sohn et al.
2007/0105495 A1 *  5/2007 Knight ................ 455/12.1

OTHER PUBLICATIONS

Hatakaeyama, Atsushi, et al., "A 256-Mb SDRAM Using a Register-Controlled Digital DLL", *IEEE Journal of Solid-State Circuit*, vol. 32, No. 11, (Nov. 1977),1728-1734.

"International Search Report and Written Opinion for application No. PCT/US2006/047321", (May 21, 2007),12 pgs.

Hatakaeyama, Atsushi, "A 256-Mb SDRAM Using a Register-Controlled Digital DLL", *IEEE Journal of Solid-State Circuit*, vol. 32, No. 11, (Nov. 1977),1728-1734.

* cited by examiner

*Primary Examiner*—Tan Trinh
(74) *Attorney, Agent, or Firm*—Dana B. Lemione; Lemione Patent Services, PLLC

(57) ABSTRACT

An integrated circuit includes clock deskew circuitry. The deskew circuitry includes a loop circuit to align an input clock signal with an output clock signal, and also aligns transmitted data with the output clock signal.

18 Claims, 8 Drawing Sheets

CLOCK DESKEWING METHOD, APPARATUS, AND SYSTEM

FIELD

The present invention relates generally to clock circuits, and more specifically to clock circuits with deskew.

BACKGROUND

Integrated circuits such as processors and memory devices typically communicate with each other using digital data signals and clock signals. Clock signals and data signals are typically "timed" or "phase aligned" with respect to each other, so that the clock signals can be used to latch the data.

FIG. 1 shows a prior art circuit to align a transmitted data signal with a received clock signal. The circuit includes clock buffer 102, divider 108, phase comparator 114, dummy clock buffer 118, delay lines 104 and 110, shift register 116, output buffer 106, and dummy output buffer 112.

The output data DQ is timed by the clock signal generated by delay line 104, which is controlled in parallel with delay line 110 by shift register 116. A delay-locked loop (DLL) circuit is formed by phase comparator 114, shift register 116, delay line 110, dummy output buffer 112, and dummy clock buffer 118. The delay of dummy output buffer 112 matches that of output buffer 106, and the delay of dummy clock buffer 118 matches that of clock buffer 102. By using matching delay circuits in the DLL, the phase of the signal on node 117 closely matches CLK, and the phase of DQ also closely matches CLK.

DESCRIPTION OF EMBODIMENTS

Figure 1:
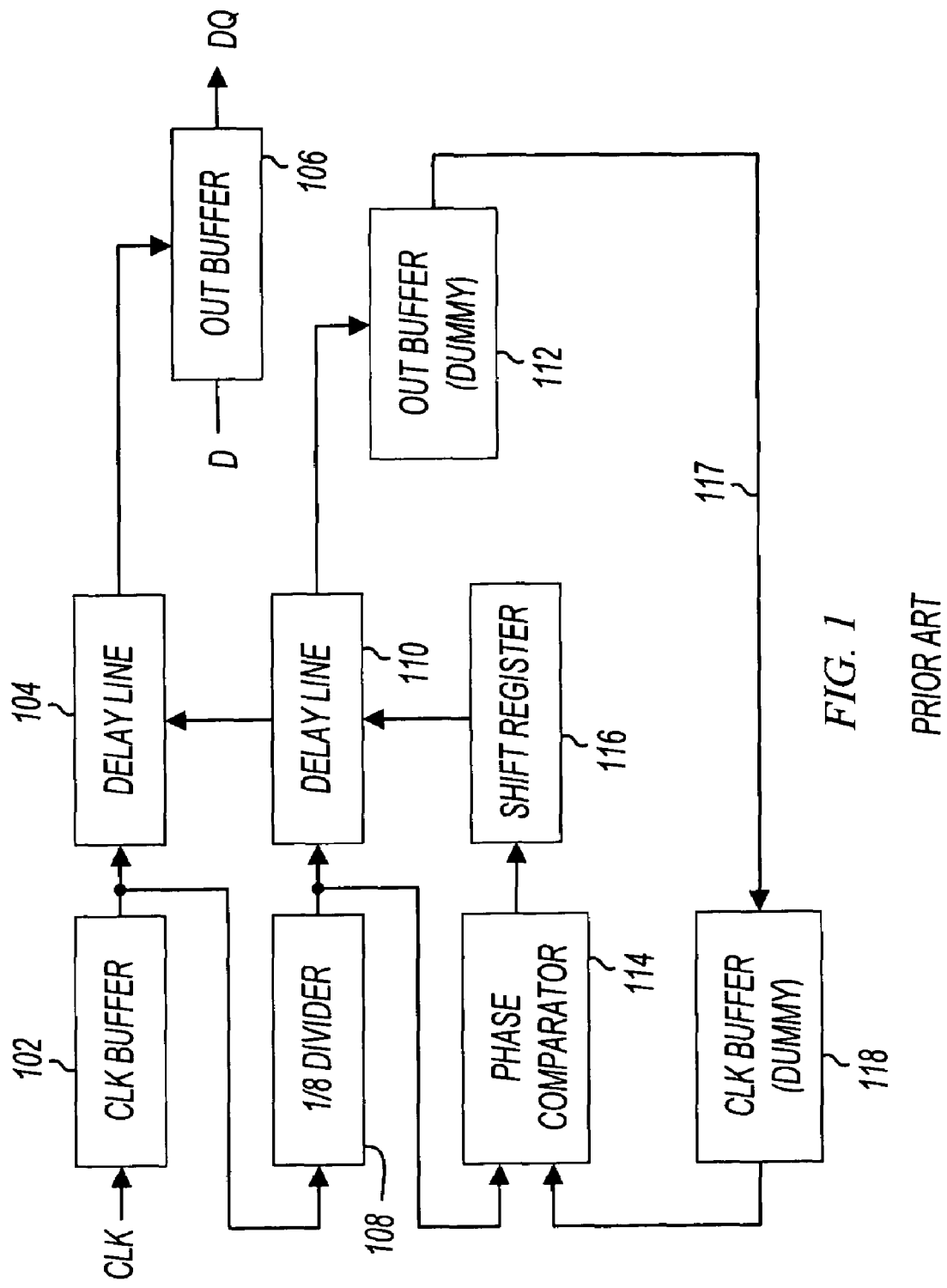
FIG. 1 shows a prior art circuit to align a transmitted data signal with a received clock signal.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 2:
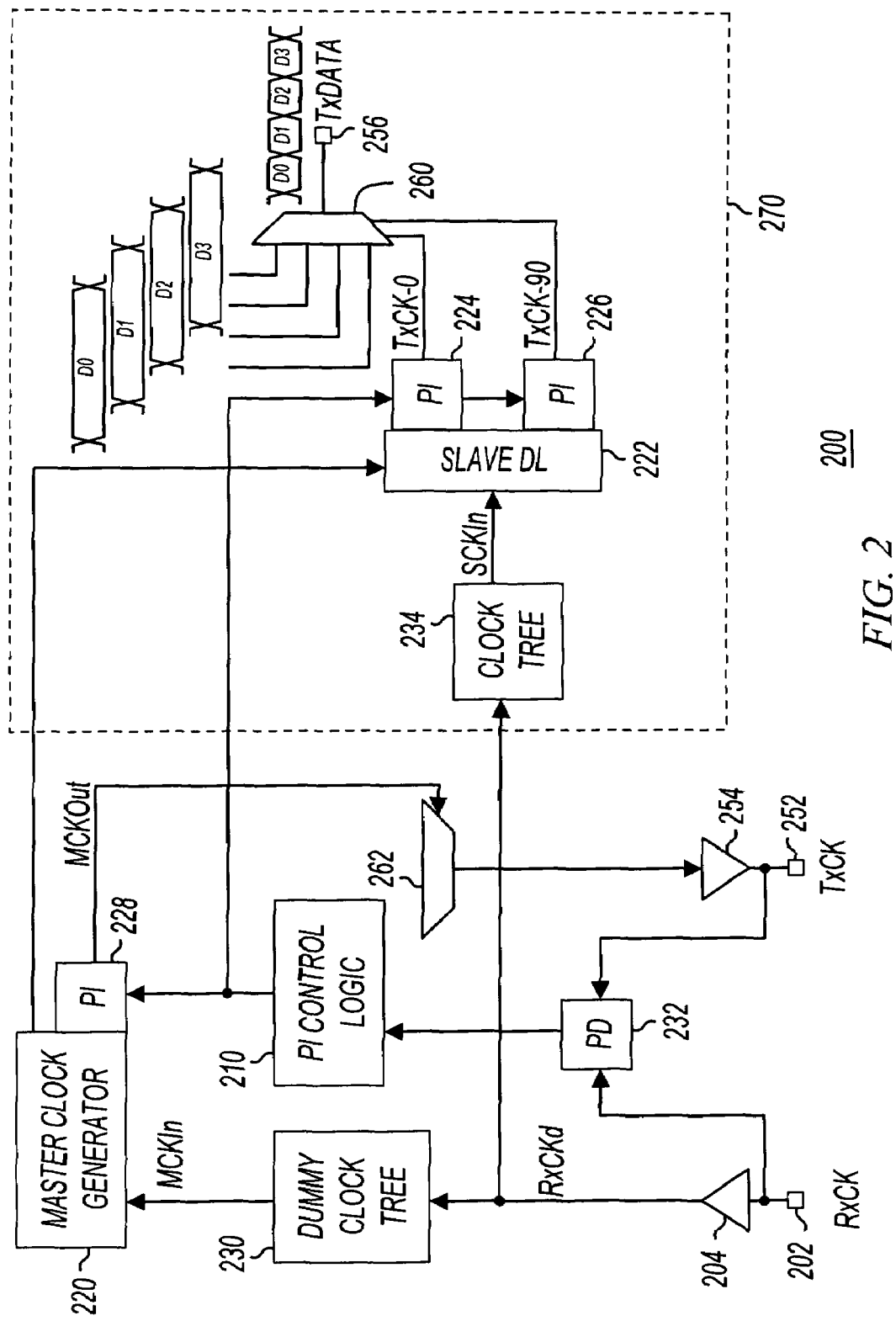
FIG. 2 shows an integrated circuit with clock deskew.

FIG. 2 shows an integrated circuit with clock deskew. Integrated circuit 200 receives an input clock signal (RxCK) on pad 202 and transmits an output clock signal (TxCK) on pad 252. Integrated circuit 200 also transmits output data (TxDATA) on pad 256. Integrated circuit 200 includes pads 202, 252, and 256, receiver 204, driver 254, dummy clock tree 230, master clock generator 220, phase interpolator (PI) 228, PI control logic 210, phase detector (PD) 232, dummy output multiplexer 262, and data output circuit 270. Data output circuit 270 includes clock tree 234, slave delay line (DL) 222, phase interpolators 224, 226, and output multiplexer 260. In some embodiments, integrated circuit 200 includes multiple data output circuits 270. Representative embodiments are described more fully below.

In some embodiments, the transmitted data signal includes more than one data symbol for each cycle of the input clock signal. For example, in some embodiments, the output data signal TxDATA may include four data symbols for each cycle of the input clock signal. Integrated circuit 200 may be used in a high-speed system that uses a forwarded, multi-phase clocking scheme, where one transition on the output clock signal is transmitted with every group of data. The remainder of this description refers to embodiments that include four data symbols for each transition on the input clock signal, but this is not a limitation of the present invention.

In operation, the input clock (RxCK) is received by receiver 204, and provided to Master clock generator 220 and slave delay line (DL) 222. As shown in FIG. 2, master clock generator 220 provides control signal(s) to slave delay line 222. In some embodiments, integrated circuit 200 includes a single master clock generator and multiple slave delay lines distributed about the integrated circuit. In other embodiments, master clock generator 220 and slave delay line 222 are combined, and operate as a single clock generator. In some embodiment, master clock generator 220 is implemented as a delay-locked loop (DLL). In other embodiments, master clock generator 220 is implemented as a phase-locked loop.

Delay line 222 produces multiple clocks of different phases. For example, delay line 222 may produce two or more clock signals having a substantially fixed phase difference, such as 45 degrees between clock phases or 90 degrees between clock phases. Phase interpolators (PI) 224 and 226 receive multiple clock signals from delay line 222, and interpolate in phase between them to produce local clock signals TxCK-0 and TxCK-90. Phase interpolators 224 and 226 provide interpolation in response to control information received from PI control logic 210. As shown in FIG. 2, TxCK-0 and TxCK-90 are offset in phase by 90 degrees, and control output multiplexer 260 to time transmit data off integrated circuit 200. In some embodiments, multiplexer 260 includes latch circuitry to latch the data, and in other embodiments, multiplexer 260 does not include a latch circuit.

Data output circuit 270 may be placed in any location on an integrated circuit die. Clock tree 234 represents the buffers and routing utilized to distribute the clock signal to slave DL 222. In embodiments with multiple data output circuits 270, clock trees 234 are balanced to have substantially equivalent delay characteristics. Dummy clock tree 230 is also balanced to have substantially equivalent delay characteristics to clock tree 234. By balancing the clock tree delays, the clock provided to the master clock generator (MCKIn) is substantially matched to the clock provided to the slave DL (SCKIn).

Master clock generator 220 produces multiple clocks that are phase matched to the multiple clocks produced by slave delay line 222. Phase interpolator 228 receives the multiple clocks from master clock generator 220 and interpolates to produce MCKOut. MCKOut is used to control dummy output multiplexer 262, which then provides a clock signal to driver 254. The delay characteristics of dummy output multiplexer 262 are matched to output multiplexer 260, so that TxCK and TxDATA are time aligned for use in a forwarded, multi-phase clocking system.

In addition to the circuits just described that align TxCK and TxDATA, integrated circuit 200 includes a loop circuit to keep RxCK and TxCK aligned. The loop circuit includes phase detector 232, PI control logic 210, phase interpolator 228, dummy multiplexer 262, and driver 254. Phase detector 232 compares the phase of RxCK and TxCK, and provides phase error information to PI control logic 210. PI control logic 210 provides phase control codes to phase interpolator 228, which then modifies the phase of MCKOut.

As mentioned above, data output circuit 270, or portions thereof, may be repeated many times in integrated circuit 200. For example, many different circuits to transmit output data may exist. Each of these circuits is supplied a clock signal through a clock tree 234, and each may also have a slave delay line, phase interpolators, and output multiplexer. In some embodiments, some or all data output circuits may share some components. For example, adjacent output circuits may share all or a portion of a clock tree, and adjacent output circuits may share slave delay lines and phase interpolators. In embodiments with multiple data output circuits 270, master clock generator 220 may provide control signals to multiple delay lines 222, and PI control logic 210 may provide control signals to multiple phase interpolators 224 and 226.

Phase interpolators 224, 226, and 228 are controlled in parallel by the phase interpolator control logic. The phase interpolator control logic operates in response to phase error information from phase detector 232 during operation. In response to the phase error information received from phase detector 232, PI control logic 210 influences the operation of the various phase interpolators in parallel.

Integrated circuit 200 may be any type of integrated circuit. For example, integrated circuit 200 may be a memory device, a controller, a processor, or any other integrated circuit that receives a clock signal and transmits a clock signal and a data signal. Various functional blocks that are part of the integrated circuit are intentionally omitted from FIG. 2 to provide clarity in this description. Although only one input clock signal, one output clock signal, and one output data signal are shown in FIG. 2, this is not a limitation of the present invention. For example, many data signals may be deskewed relative to a single clock signal.

Figure 3:
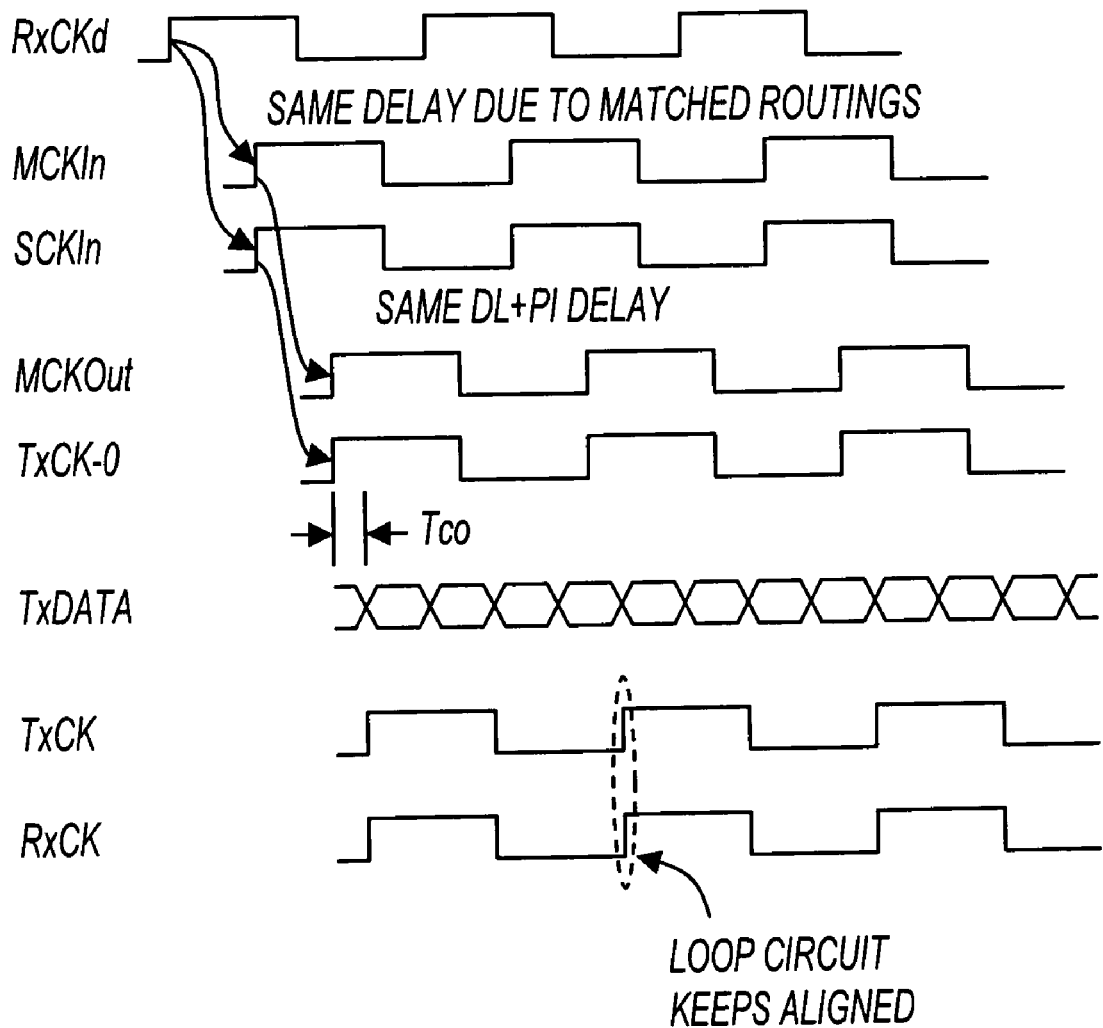
FIG. 3 shows a timing diagram.

FIG. 3 shows a timing diagram. The timing diagram of FIG. 3 shows the operation of the circuits shown in FIG. 2. The output of clock receiver 204, RxCKd, is the point at which the clock signals diverge. From RxCKd, one path goes to slave DL 222 and the other path goes to Master clock generator 220. Due to matched routings, input to Master clock generator 220 (MCKIn) is in phase with the input to slave DL 222 (SCKIn). With identical delay line control voltages and PI control codes, the outputs of Master clock generator 220 (MCKOut) and slave DL 222 (TxCK-0) are also in phase. Signal TxCK-0 feeds the transmit data path; thus, after a clock-to-output delay (Tco), the output data (TxDATA) becomes valid. In the mean time, MCKOut goes through dummy output multiplexer 262 and the clock output driver with the same Tco delay and becomes the output clock (TxCK). Due to the matched delay, TxCK is aligned with TxDATA. Through the PI control logic, the loop's phase detector keeps TxCK aligned with RxCK, as shown in the timing diagram of FIG. 3.

Figure 4:
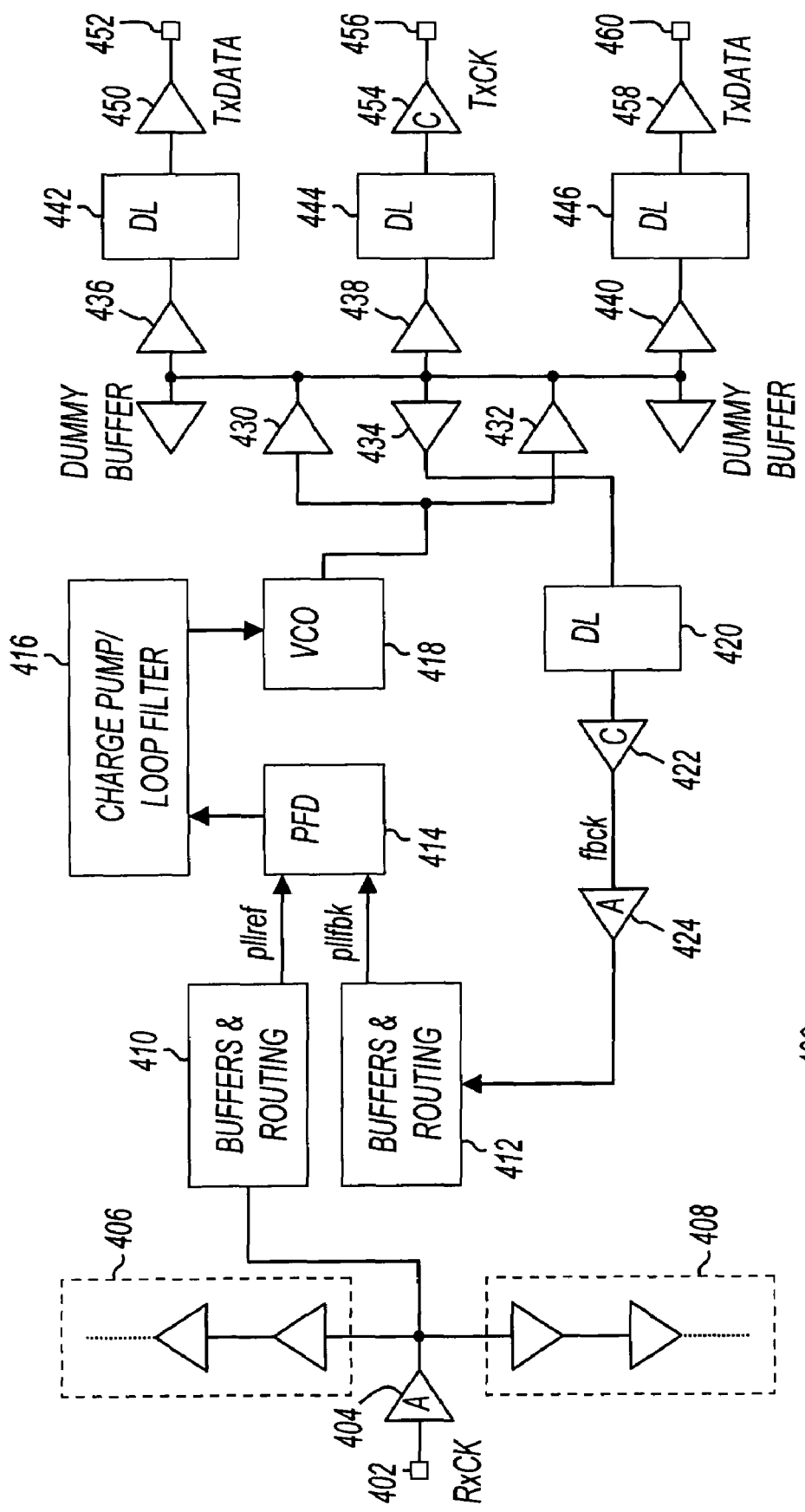
FIG. 4 shows an integrated circuit with clock deskew.
Figure 5:
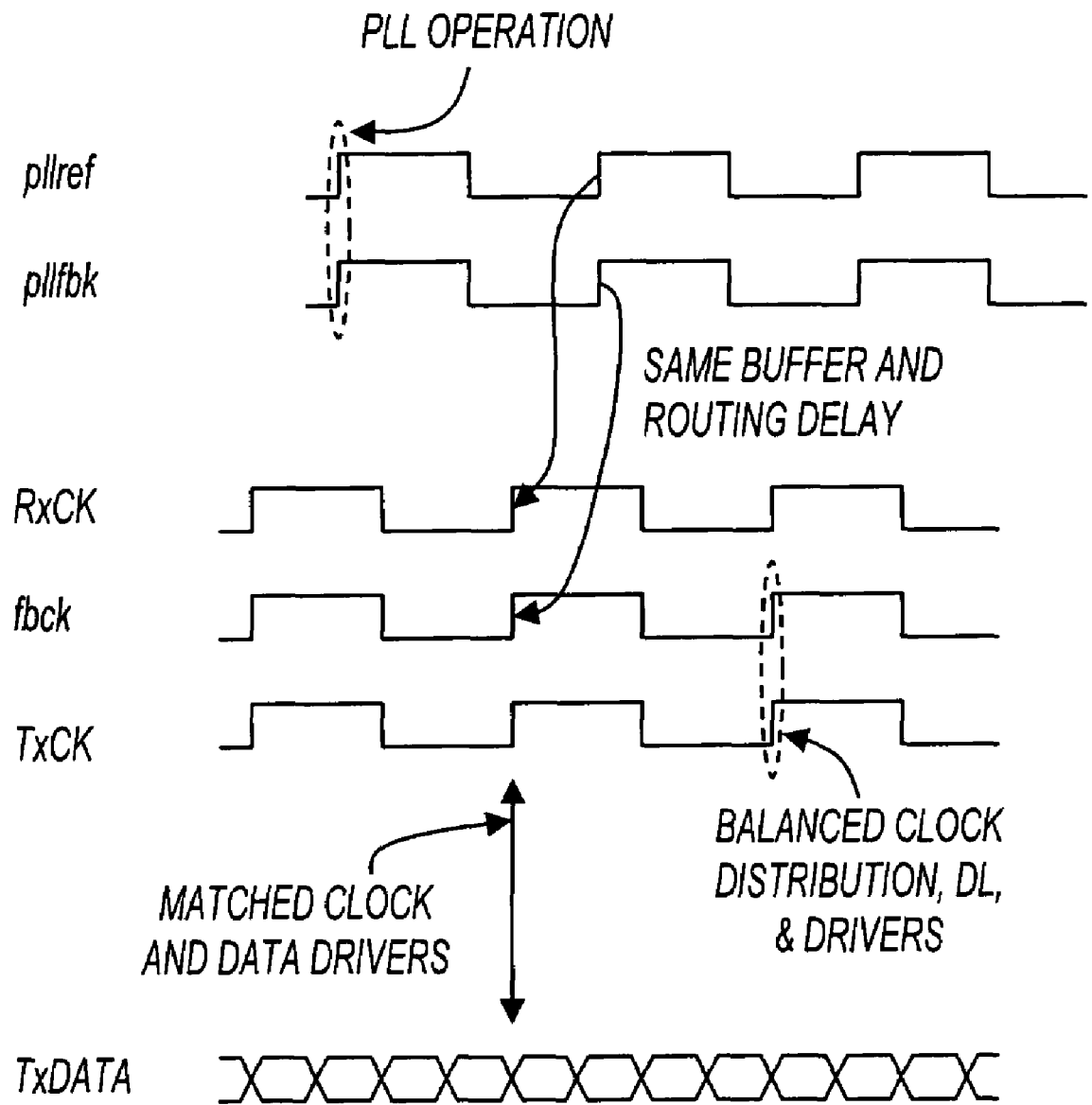
FIG. 5 shows a timing diagram.

FIG. 4 shows an integrated circuit with clock deskew, and FIG. 5 shows a timing diagram illustrating the operation of the circuits of FIG. 4. Integrated circuit 400 includes input clock pad 402, receiver 404, and buffers and routing 406, 408, 410, and 412. Integrated circuit 400 also includes phase/frequency detector (PFD) 414, charge pump and loop filter 416, voltage controlled oscillator (VCO) 418, and delay lines (DL) 420, 442, 444, and 446. Integrated circuit 400 further includes a balanced clock distribution network that includes buffers 430, 432, 434, 436, 438, 440, and two dummy buffers. Integrated circuit 400 further includes drivers 450, 454, and 458, and output pads 452, 456, and 460.

In operation, an input clock signal (RxCK) is received on pad 402 and by receiver 404. Receiver 404 is shown with an "A" to show that it is intentionally matched with other buffer/receivers shown with an "A." The output of receiver 404 is fanned out within integrated circuit 400 to provide clock signals to various circuits. For example, buffers and routing 410 provide a clock to the rest of the circuitry shown in FIG. 4. Buffers and routing 406 and 408 are included in FIG. 2 to signify that many other circuits within integrated circuit 400 may utilize the input clock.

Buffers and routing 410 provides a clock signal "pllref" to PFD 414. PFD 414 is part of a loop circuit that causes pllref and pllfbk to be substantially locked in phase as shown in FIG. 5. The loop circuit includes PFD 414, charge pump and loop filter 416, VCO 418, buffers 430, 432, and 434, DL 420, buffers 422 and 424, and buffers and routing 412. As shown in FIG. 4, the loop circuit operates as a phase-locked loop (PLL). In some embodiments, VCO 418 is replaced by a delay line, and the loop circuit operates as a delay-locked loop (DLL).

The loop circuit produces a clock signal driven into the balanced clock distribution network by buffers 430 and 432. From there, buffer 434 feeds back a version of the clock signal, and buffers 436, 438, and 440 provide versions of the clock signal for either transmitting directly off the integrated circuit, or for timing data to be transmitted off the integrated circuit. For example, buffer 454 may transmit an output clock signal (TxCK) off the integrated circuit. Also for example, buffers 450 and 458 may transmit output data (TxDATA) off the integrated circuit. Although only a buffer is shown, a synchronous element such as a latch or flip-flop may be used to drive output data off the integrated circuit. Further, a multiplexer such as output multiplexer 260 (FIG. 2) may used. Buffer 454 is shown with a "C" to show that it is intentionally matched with other buffers shown with a "C."

In operation, RxCK and fbck are substantially phase matched because pllref and pllfbk are matched by virtue of the loop operation, and because both RxCK and fbck traverse matched circuits to create pllref and pllfbk. The matched circuits include buffer/receivers 404 and 424, and buffers and routing 410 and 412. This timing is shown near the top of FIG. 3. In addition to fbck being matched to RxCK, fbck is also substantially phase matched to TxCK. Both fbck and TxCK are generated from VCO 418, and each has traversed a substantially matched delay path. For example, TxCK has traversed buffers 430 and 432 in parallel, buffer 438, DL 444, and buffer 454; and fbck has traversed buffers 430 and 432 in parallel, buffer 434, DL 420, and buffer 422. Accordingly, RxCK and TxCK are substantially phase matched. This timing is shown near the center of FIG. 3.

In addition to RxCK and TxCK being phase matched, TxDATA is aligned with TxCK because TxCK is used to time TxDATA off the integrated circuit. Although not specifically shown in FIG. 4, the delay lines may all be controlled by a master DLL in same manner as described with reference to FIG. 2. Further, in some embodiments, the loop circuit shown in FIG. 4 is replaced by a DLL, and the DLL provides delay control words to each of the delay lines shown.

Integrated circuit 400 may be any type of integrated circuit. For example, integrated circuit 400 may be a memory device, a controller, a processor, or any other integrated circuit that receives a clock signal and transmits a clock signal and a data signal. Various functional blocks that are part of the integrated circuit are intentionally omitted from FIG. 4 to provide clarity in this description. Although only one input clock signal, one output clock signal, and one output data signal are shown in FIG. 4, this is not a limitation of the present invention. For example, many data signals may be deskewed relative to a single clock signal.

Figure 6:
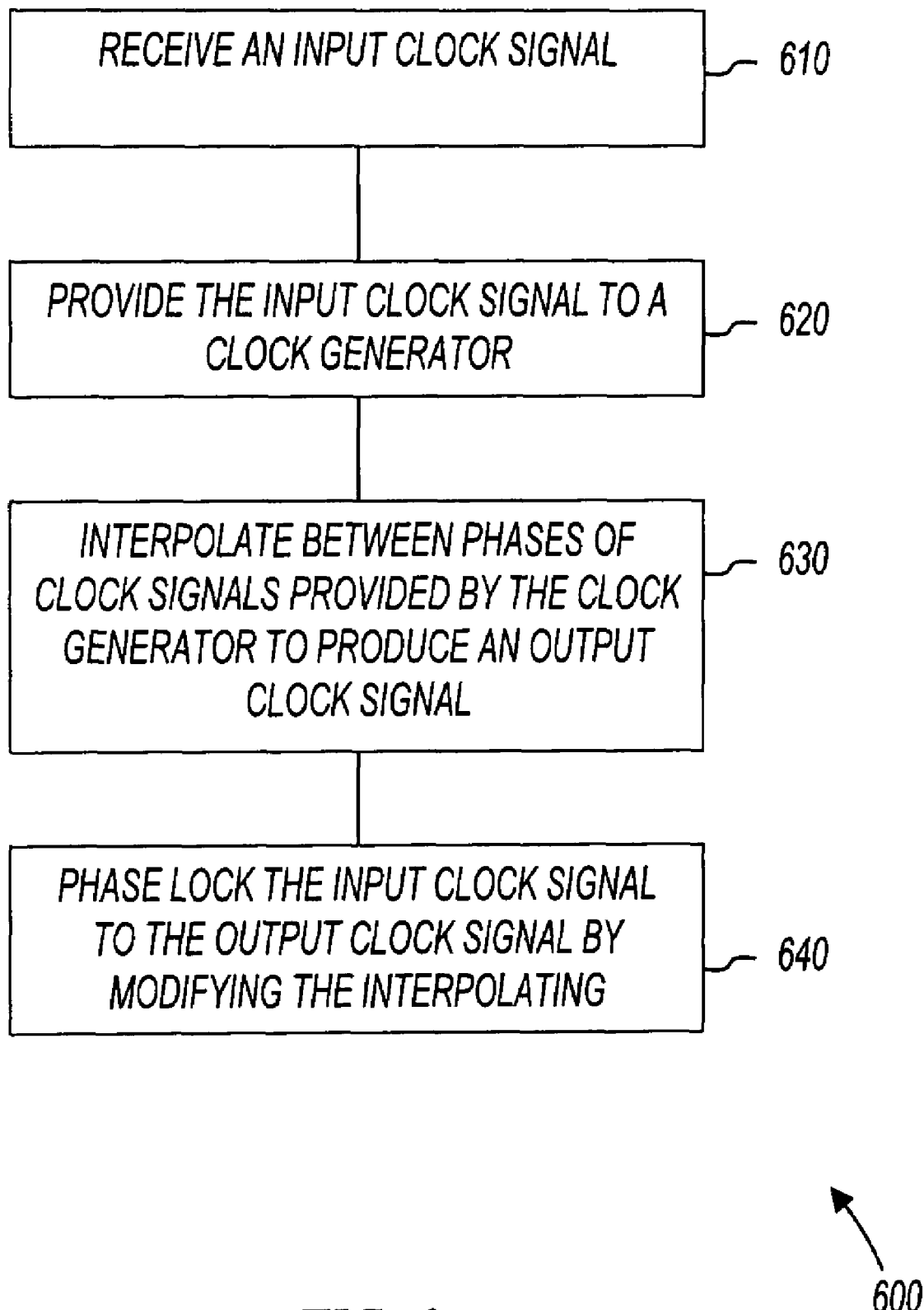
FIG. 6 shows a flowchart in accordance with various embodiments of the present invention.

FIG. 6 shows a flowchart in accordance with various embodiments of the present invention. In some embodiments, method 600 may be used to perform clock deskew. In some embodiments, method 600, or portions thereof, is performed by an input/output (I/O) circuit in an integrated circuit, embodiments of which are shown in the various figures. In other embodiments, method 600 is performed by a controller or memory device. Method 600 is not limited by the particular type of apparatus performing the method. The various actions in method 600 may be performed in the order presented, or may be performed in a different order. Further, in some embodiments, some actions listed in FIG. 6 are omitted from method 600.

Method 600 begins at 610 in which an input clock signal is received. At 620, the input clock signal is provided to a clock generator such as a phase-locked loop or delay-locked loop. For example, the actions of 610 and 620 may correspond to integrated circuit 200 (FIG. 2) receiving TxCK and providing the clock to master clock generator 220.

At 630, phase interpolation is performed. The clock generator provides multiple clock signals, and phase interpolation between the multiple clock signals is performed to produce an output clock signal. Referring now back to FIG. 2, the actions of 630 may correspond to phase interpolator 228 producing the output clock signal. At 640, the input clock signal is phase locked to the output clock signal by modifying the interpolating performed at 630. For example, PD 232 phase locks RxCK to TxCK.

Figure 7:
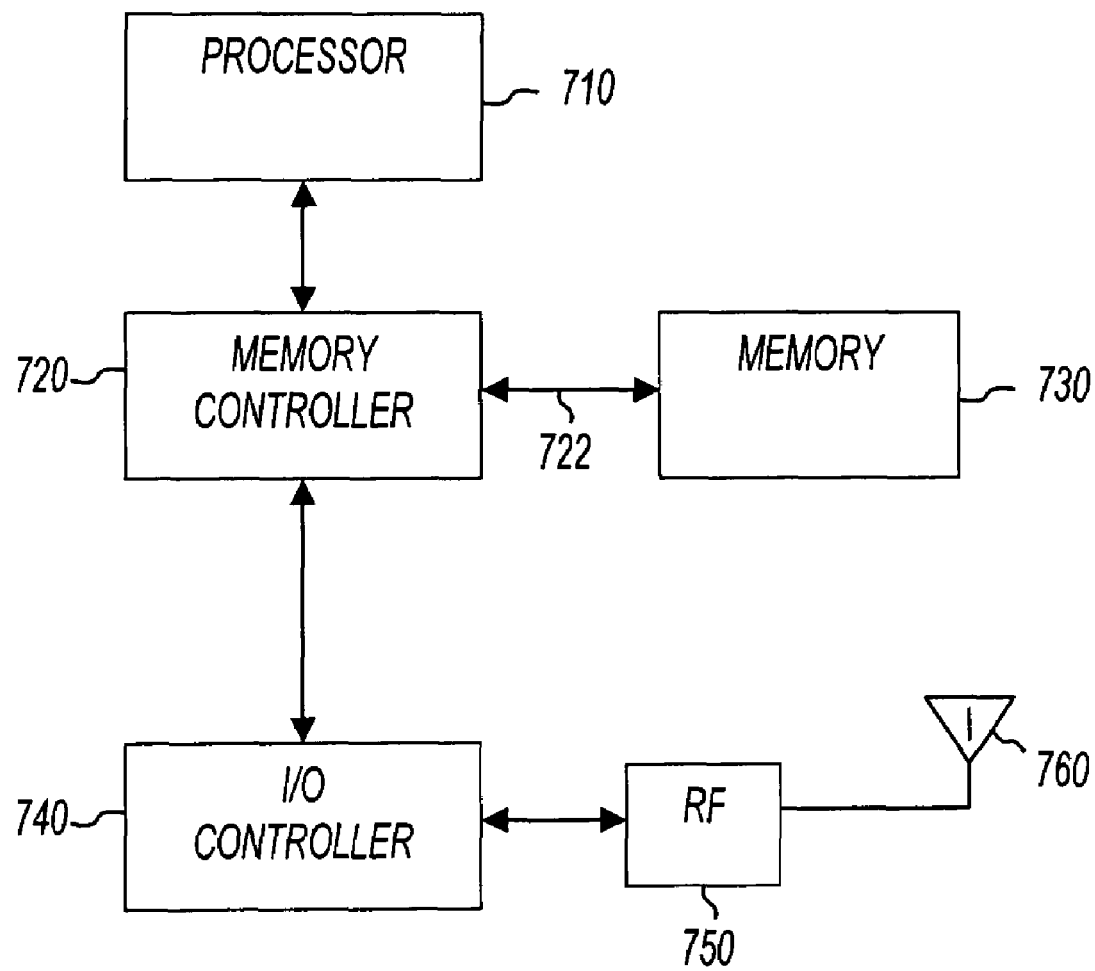
FIGS. 7 and 8 show diagrams of electronic systems in accordance with various embodiments of the present invention.

FIG. 7 shows an electronic system in accordance with various embodiments of the present invention. Electronic system 700 includes processor 710, memory controller 720, memory 730, input/output (I/O) controller 740, radio frequency (RF) circuits 750, and antenna 760. In operation, system 700 sends and receives signals using antenna 760, and these signals are processed by the various elements shown in FIG. 7. Antenna 760 may be a directional antenna or an omni-directional antenna. As used herein, the term omni-directional antenna refers to any antenna having a substantially uniform pattern in at least one plane. For example, in some embodiments, antenna 760 may be an omni-directional antenna such as a dipole antenna, or a quarter wave antenna. Also for example, in some embodiments, antenna 760 may be a directional antenna such as a parabolic dish antenna, a patch antenna, or a Yagi antenna. In some embodiments, antenna 760 may include multiple physical antennas.

Radio frequency circuit 750 communicates with antenna 760 and I/O controller 740. In some embodiments, RF circuit 750 includes a physical interface (PHY) corresponding to a communications protocol. For example, RF circuit 750 may include modulators, demodulators, mixers, frequency synthesizers, low noise amplifiers, power amplifiers, and the like. In some embodiments, RF circuit 750 may include a heterodyne receiver, and in other embodiments, RF circuit 750 may include a direct conversion receiver. In some embodiments, RF circuit 750 may include multiple receivers. For example, in embodiments with multiple antennas 760, each antenna may be coupled to a corresponding receiver. In operation, RF circuit 750 receives communications signals from antenna 760, and provides analog or digital signals to I/O controller 740. Further, I/O controller 740 may provide signals to RF circuit 750, which operates on the signals and then transmits them to antenna 760.

Processor 710 may be any type of processing device. For example, processor 710 may be a microprocessor, a microcontroller, or the like. Further, processor 710 may include any number of processing cores, or may include any number of separate processors.

Memory controller 720 provides a communications path between processor 710 and other devices shown in FIG. 7. In some embodiments, memory controller 720 is part of a hub device that provides other functions as well. As shown in FIG. 7, memory controller 720 is coupled to processor 710, I/O controller 740, and memory 730. Memory controller 720 may communicate with memory 730 using a forwarded clock on bus 722. For example, memory controller 720 may utilize any of the clock deskew embodiments described herein to transmit clocks signals and data signals to memory 730.

Memory 730 may include multiple memory devices. Further, each of the memory devices may include the circuitry described with reference to FIG. 2 or FIG. 4. Memory 730 may be any type of memory technology. For example, memory 730 may be random access memory (RAM), dynamic random access memory (DRAM), static random access memory (SRAM), nonvolatile memory such as FLASH memory, or any other type of memory.

Memory 730 may represent a single memory device or a number of memory devices on one or more memory modules. Memory controller 720 provides data through bus 722 to memory 730 and receives data from memory 730 in response to read requests. Commands and/or addresses may be provided to memory 730 through conductors other than bus 722 or through bus 722. Memory controller 730 may receive data to be stored in memory 730 from processor 710 or from another source. Memory controller 720 may provide the data it receives from memory 730 to processor 710 or to another destination. Bus 722 may be a bi-directional bus or unidirectional bus. Bus 722 may include many parallel conductors. The signals may be differential or single ended. In some embodiments, bus 722 operates using a forwarded, multiphase clock scheme.

Memory controller 720 is also coupled to I/O controller 740, and provides a communications path between processor 710 and I/O controller 740. I/O controller 740 includes circuitry for communicating with I/O circuits such as serial ports, parallel ports, universal serial bus (USB) ports, and the like. As shown in FIG. 7, I/O controller 740 provides a communications path to RF circuits 750. Memory controller 720 and I/O controller 740 may include any of the clock deskew embodiments described herein. For example, memory controller 720 or I/O controller 740 may include the circuitry described with reference to FIG. 2 or FIG. 4.

Figure 8:
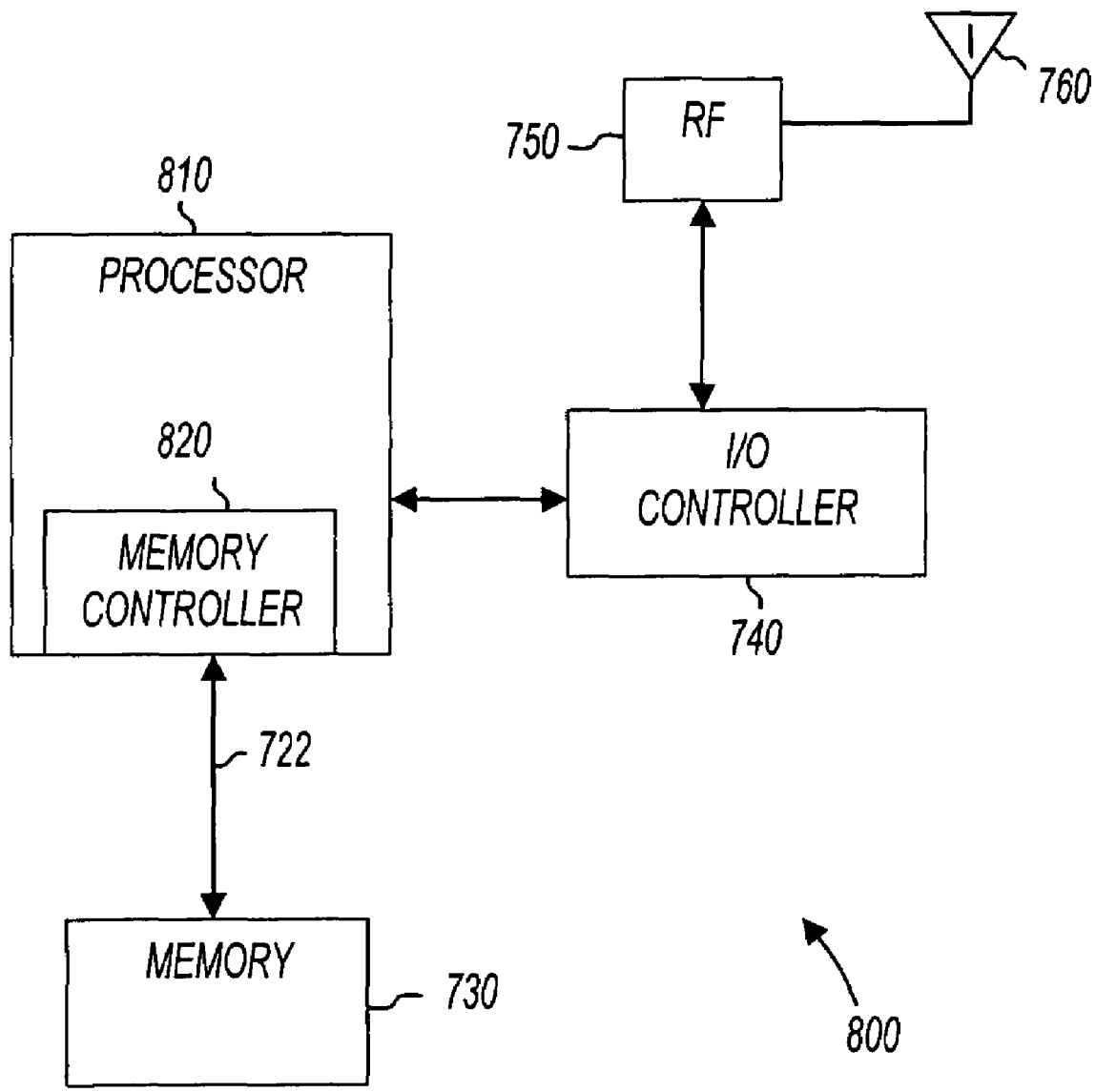

FIG. 8 shows an electronic system in accordance with various embodiments of the present invention. Electronic system 800 includes memory 730, I/O controller 740, RF circuits 750, and antenna 760, all of which are described above with reference to FIG. 7. Electronic system 800 also includes processor 810 and memory controller 820. As shown in FIG. 8, memory controller 820 is included in processor 810. Processor 810 may be any type of processor as described above with reference to processor 710 (FIG. 7). Processor 810 differs from processor 710 in that processor 810 includes memory controller 820, whereas processor 710 does not include a memory controller. Memory controller 820 may include any of the clock deskew embodiments described herein.

Example systems represented by FIGS. 7 and 8 include desktop computers, laptop computers, cellular phones, personal digital assistants, wireless local area network interfaces, or any other suitable system. Many other systems uses for clock deskew exist. For example, the clock deskew embodiments described herein may be used in a server computer, a network bridge or router, or any other system with or without an antenna.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An integrated circuit comprising:
 a clock input pad to receive an input clock signal;
 a clock output pad to transmit an output clock signal;
 a loop circuit to phase lock the input clock signal and the output clock signal;
 a slave circuit responsive to the loop circuit to produce a first clock signal having a phase substantially equal to the output clock signal and a second clock signal having a phase offset substantially 90 degrees from the first clock signal; and
 an output multiplexer having control inputs coupled to be responsive to the first and second clock signals, and having data inputs coupled to receive four separate phases of data signals.

2. The integrated circuit of claim 1 wherein the loop circuit includes a phase detector to compare phases of the input clock signal and the output clock signal.

3. The integrated circuit of claim 2 further comprising a clock generator to generate a plurality of clock signals of different phases from the input clock signal.

4. The integrated circuit of claim 3 wherein the loop circuit further comprises a first phase interpolator to generate the output clock signal from the plurality of clock signals from the clock generator.

5. The integrated circuit of claim 4 wherein the loop circuit further comprises control logic to influence operation of the first phase interpolator in response to the phase detector.

6. The integrated circuit of claim 5, wherein the slave circuit further comprises a delay line responsive to the clock generator.

7. The integrated circuit of claim 6, wherein the slave circuit further comprises at least one other phase interpolator coupled to the delay line to generate the first and second clock signals.

8. The integrated circuit of claim 7 wherein the operation of the at least one other phase interpolator is influenced by the control logic.

9. The integrated circuit of claim 1 wherein the loop circuit includes a dummy output multiplexer having a delay characteristic substantially equivalent to the output multiplexer.

10. An integrated circuit comprising:
 a clock input pad to receive an input clock;
 a clock output pad to transmit an output clock;
 a data output pad to transmit a data signal;
 a loop circuit to phase align the output clock with the input clock where the output clock is derived from the input clock; and
 data output circuitry including an output multiplexer coupled to drive the data output pad, the multiplexer having a control input coupled to receive a clock signal related to the output clock.

11. The integrated circuit of claim 10 wherein the loop circuit includes a phase-locked loop to generate the output clock.

12. The integrated circuit of claim 11 further comprising clock routing circuitry having a first delay characteristic coupled between the clock input pad and the phase-locked loop.

13. The integrated circuit of claim 12 further comprising clock routing circuitry having a second delay characteristic coupled between the phase-locked loop and the clock output pad.

14. The integrated circuit of claim 13 wherein the phase-locked loop comprises a feedback path having both the first and second delay characteristics.

15. An electronic system comprising:
 an antenna;
 a radio frequency circuit coupled to the antenna;
 a memory device; and
 a controller coupled to the radio frequency circuit and the memory device, the controller including a clock input pad to receive an input clock signal, a clock output pad to transmit an output clock signal, a loop circuit to phase lock the input clock signal and the output clock signal, a slave circuit responsive to the loop circuit to produce a first clock signal having a phase substantially equal to the output clock signal and a second clock signal having a phase offset substantially 90 degrees from the first clock signal, and an output multiplexer having control inputs coupled to be responsive to the first and second clock signals, and having data inputs coupled to receive four separate phases of data signals.

16. The electronic system of claim 15 wherein the loop circuit includes a phase detector to compare phases of the input clock signal and the output clock signal.

17. The electronic system of claim 16 wherein the controller further comprises a clock generator to generate a plurality of clock signals of different phases from the input clock signal.

18. The electronic system of claim 17 wherein the loop circuit further comprises a first phase interpolator to generate the output clock signal from the plurality of clock signals from the clock generator.

* * * * *

UNITED STATES PATENT AND TRADEMARK OFFICE
CERTIFICATE OF CORRECTION

PATENT NO. : 7,668,524 B2  Page 1 of 1
APPLICATION NO. : 11/318118
DATED : February 23, 2010
INVENTOR(S) : Law et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1043 days.

Signed and Sealed this

Fourth Day of January, 2011

David J. Kappos
*Director of the United States Patent and Trademark Office*